United States Patent [19]
Anderson et al.

[11] Patent Number: 5,702,775
[45] Date of Patent: Dec. 30, 1997

[54] MICROELECTRONIC DEVICE PACKAGE AND METHOD

[75] Inventors: Michael John Anderson, Phoenix; Gary Carl Johnson, Tempe; Mark Phillip Popovich, Gilbert, all of Ariz.; Jeffrey Eames Christensen, Scottsdale, Ill.

[73] Assignee: Motorola, Inc., Schaumburg, Ill.

[21] Appl. No.: 578,801

[22] Filed: Dec. 26, 1995

[51] Int. Cl.$^6$ ........................................... B32B 3/00
[52] U.S. Cl. .................... 428/1; 385/14; 385/39; 385/47; 385/51; 428/68; 428/70; 428/76; 428/413; 428/421; 428/429; 428/435; 428/436; 428/442; 428/447; 428/451; 428/473.5; 428/480; 310/340
[58] Field of Search ................ 428/1, 76, 68, 428/70, 413, 421, 426, 429, 435, 436, 442, 446, 447, 451, 473.5, 480; 385/14, 47, 39, 51; 310/340

[56] References Cited

U.S. PATENT DOCUMENTS

| | | | |
|---|---|---|---|
| 4,645,551 | 2/1987 | Adams et al. | 156/82 |
| 5,150,438 | 9/1992 | Brown | 385/14 |
| 5,294,487 | 3/1994 | Ohashi | 428/308.4 |
| 5,410,789 | 5/1995 | Noto et al. | 29/25.35 |
| 5,593,721 | 1/1997 | Daidai | 310/340 |

OTHER PUBLICATIONS

"Deposition Parameter Studies and Surface Acoustic Wave Characterization of PECVD Silicon Nitride Films on Lithium Niobate" by J.H. Hines, D.C. Malocha, Kalpathy B. Sundaram, K.J. Casey and K.R. Lee, IEEE Members, from IEEE Transactions On Ultrasonics, Ferroelectrics, and Frequency Control, vol. 42, No. 3, May 1995.

"Surface Acoustic Wave Characterization of PECVD Films On Gallium Arsenide", by F.S Hickernell and T.S. Hickernell, Fellow, IEEE and Member, IEEE, from IEEE Transactions on Ultrasonics, Ferroelectrics and Frequency Control, vol., 42, No. #, May 1995.

Primary Examiner—Nasser Ahmad
Attorney, Agent, or Firm—Brian M. Mancini

[57] ABSTRACT

A method (38) for packaging a microelectronic device (10) and a device (10) packaged by the method (38). The method (38) includes a step of providing (42) a first material (16) on an active surface of the microelectronic device (10). The first material (16) has a first temperature coefficient of expansion. The method (38) also includes steps of heating (46) the microelectronic device (10) and the first material (16) to a predetermined first temperature and molding (48) a second material (20) about the microelectronic device (10) and the first material (16). The second material (20) has a second temperature coefficient of expansion less than that of the first material (16). A final step of cooling (50) the first material (16), the second material (20) and the microelectronic device (10) provides a packaged microelectronic device (30).

12 Claims, 1 Drawing Sheet

MICROELECTRONIC DEVICE PACKAGE AND METHOD

FIELD OF THE INVENTION

This invention relates in general to the field of frequency selection components, in particular to packaging of acoustic wave frequency selection components and more particularly to an improved packaging technique and apparatus for acoustic wave frequency selection components.

BACKGROUND OF THE INVENTION

A broad variety of new demands is being placed on the electromagnetic spectrum, leading to difficulty in allocating radio wave frequency bands as new kinds of equipment based on radio wave communication are developed. Such demands provide pressure to employ progressively higher radio frequencies (e.g., >500 megahertz) and need to utilize spectral space more efficiently. These trends create requirements for frequency selection components capable of high frequency operation and increasingly narrow passbands. Additionally needed are devices having low insertion loss coupled with improved out-of-band signal rejection, in a small form factor and with low power consumption.

Acoustic wave devices are becoming particularly important in the construction of electronic signal processing equipment, such as radios, paging devices, and other high frequency electronic apparatus, because they can be readily constructed on planar surfaces using integrated circuit fabrication techniques, are robust and compact, require no initial or periodic adjustment and consume no static power. Thus, SAW resonators and other types of acoustic wave frequency selection components are extremely desirable for high frequency filtering applications.

The surface vibrations that cause these devices to have extreme utility in modern communications apparatus lead to packaging constraints that differ from those of most microelectronic components. These vibrations are damped (and the frequency selection characteristics impaired or destroyed) by the presence of surface contamination and especially by condensation of liquids on the device surface. Typically this is obviated by employing hermetic packages that do not physically touch the active device surface. As a result, it has been difficult or impossible to provide packages for these devices using technologies (e.g., transfer molding) that have been developed for other types of microelectronic parts.

A second problem that hermetically sealed packages engender is that the finished, packaged device is much larger than the SAW device die. A reduction in size and/or weight of the completed frequency selection component provides significant advantages in the applications for which these devices are designed, such as portable telephones, paging apparatus and the like.

A third problem that arises is that hermetic packages typically include a higher labor content than, for example, transfer molded packages. This, in turn, is reflected in the total labor content of the completed communications apparatus in which these devices are used.

What are needed are apparatus and techniques for acoustic wave device packaging that provide a small, light-weight device package having an open area above the die surface, that do not require substantial internal volume and that are easily implemented in a fashion consistent with current acoustic device design, fabrication and use practices.

DETAILED DESCRIPTION OF THE DRAWINGS

Figure 1:
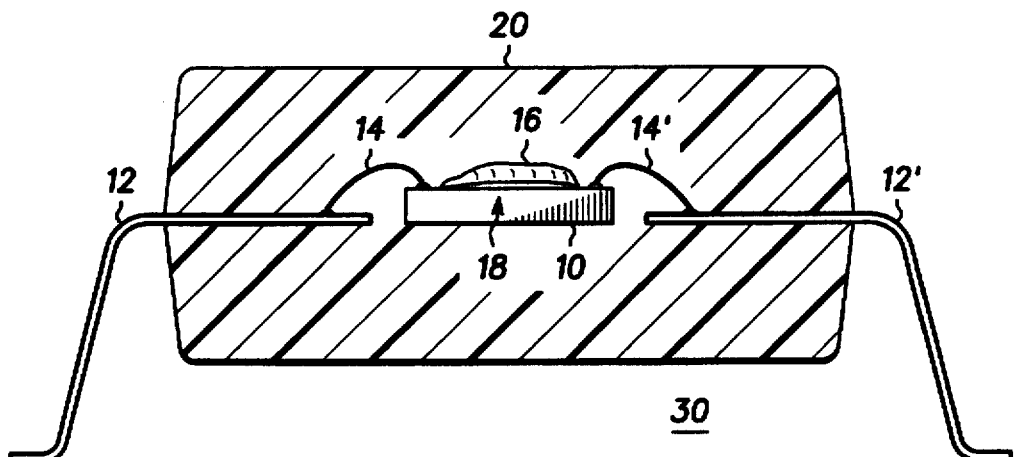
FIG. 1 shows a simplified side view, in section, of an acoustic wave filter and package in accordance with the present invention.

FIG. 1 shows a simplified side view, in section, of acoustic wave filter 10 and package 20 in accordance with the present invention. Packaged SAW device 30 includes leads 12, 12' for making electrical contact to SAW die 10 via bond wires 14, 14' as is known in the art. SAW die 10 also includes first material 16 disposed at least over an "active area" on a surface of SAW die 10. The "active area" is that area over which acoustic waves must be able to propagate in order for SAW die 10 to function as intended and includes one or more acoustic wave transducers. As employed herein, the term "SAW" is used to include surface acoustic waves, surface skimming bulk acoustic waves and other types of acoustic waves that may be useful in frequency selection components. Typically, SAW die 10 is manufactured from piezoelectric materials such as $LiNbO_3$, $LiTaO_3$, $LiB_4O_7$, quartz, ZnO, CdS, GaAs and the like (including silicon with an overlay of piezoelectric material such as ZnO), while suitable transducer structures (not illustrated) may include aluminum or alloys thereof. SAW die 10 may also include a passivation layer (not illustrated) of dielectric material chosen to have suitable acoustic properties (i.e., low acoustic losses) such as hydrogenated silicon nitride (see, e.g., "Deposition Parameter Studies and Surface Acoustic Wave Characterization of PECVD Silicon Nitride Films on Lithium Niobate" by J. H. Hines et al., IEEE Trans. Ultrasonics, Ferroelectrics and Frequency Control, Vol. 42, No. 3, May 1995, pp. 397–403 or "Surface Acoustic Wave Characterization of PECVD Films on Gallium Arsenide" by F. S. Hickernell and T. S. Hickernell, IEEE Trans. Ultrasonics, Ferroelectrics and Frequency Control, Vol. 42, No. 3, May 1995, pp. 410–415, which are hereby incorporated herein by reference) disposed on the surface of SAW die 10.

FIG. 1 includes a detailed side view, in section, of SAW die 10 and first material 16, illustrating optional opening 18 disposed therebetween. Opening 18 has a very high surface area to volume ratio and, for best results (i.e., lowest insertion loss) needs to extend over at least the active area of SAW die 10. The surface area to volume ratio realized by this process does not lend itself to condensation phenomena that may occur in prior art device packages having, for example, water (or other volatile material) contamination in the package.

Figure 2:
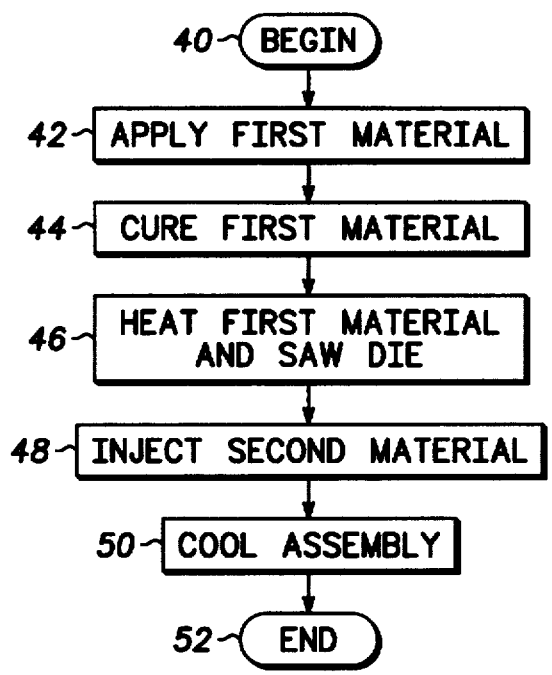
FIG. 2 is a flow chart for a process for realizing the packaged acoustic wave filter of FIG. 1.

FIG. 2 is a flow chart of process 38 for realizing packaged acoustic wave filter 30 of FIG. 1. Process 38 begins (block 40) by providing (block 42) first material 16, which may be chosen to have a high temperature coefficient of expansion if gap 18 is desired, on a surface of SAW die 10 (FIG. 1) to cover at least the active area on SAW die 10. First material 16 may be applied by a number of processes such as screen printing, dispensing etc. and this may be carried out prior to dicing or post-dicing. First material 16 may be cured (block 44), if desirable, and optionally is treated to increase adhesion between first material 16 and second material 20 by, for example, the processes described in U.S. Pat. No. 4,645,551 (Feb. 24, 1987) entitled "Method of Making an Optocoupler", which is hereby incorporated herein by reference. In the alternative or in addition, the surface of SAW die 10 may also be treated with a releasing agent prior to applying first material 16 in order to improve delamination of first material 16 from that surface. Typical methods for applying release agents include spinning or dipping for liquid agents, spraying or chemical vapor deposition or dispensing thixotropic materials in appropriate amounts. Alternatively, photodefinition techniques or screen printing may be employed. Bonding between silicone compounds and SAW substrate is typically chemical bonding between the oxygen in the silicone compounds and hydroxyl groups on the substrate surface, so when first material 16 is chosen to be a silicone compound and delamination of first material 16 from substrate 10 is desired, either "ties up" the hydroxyl groups or mechanically isolates the silicone from the substrate surface. Examples of, and commercial sources for, materials suitable for use as first material 16, second material 20, lead frame materials (corresponding to leads 12, 12') and releasing agents are given below in Tables I–IV, respectively.

TABLE I

Materials suitable for use as first material 16.

| TRADE NAME | CHEMICAL NAME | SUPPLIER | ADDRESS |
|---|---|---|---|
| Hipec 6633 | dimethyl siloxane | Dow Corning | Midland, MI |
| Hipec 6101 | dimethyl siloxane | Dow Corning | Midland, MI |
| Hipec Q1-4939 | dimethyl siloxane | Dow Corning | Midland, MI |

TABLE II

Materials suitable for use as second material 20.

| TRADE NAME | CHEMICAL NAME | SUPPLIER | ADDRESS |
|---|---|---|---|
| EMC6300H | epoxy novolak | Sumitomo Plastics | Santa Clara, CA |
| PR-9 | polyester | Thermoset Plastics Inc. | Indianapolis IN |
|  | phenolic | ICI Fiberite | Winona, MN |
|  | polytetrafluoroethylene | RTP | Winona, MN |
|  | liquid crystal polymer | RTP | Winona, MN |
| Amodel | polyaryletherketones | Amoco | Alpharetta, GA |
| Ultem | polyetherimide | General Electric | Pittsfield, MA |

TABLE III

Leadframe materials and suppliers.

| TRADE NAME | CHEMICAL NAME | SUPPLIER | ADDRESS |
|---|---|---|---|
| 194 | copper | Olin Brass | Yorba Linda, CA |
| alloy 42 | iron nickel | Olin Brass | Yorba Linda, CA |

TABLE IV

Materials suitable for use as releasing agents.

| TRADE NAME | CHEMICAL NAME | SUPPLIER | ADDRESS |
|---|---|---|---|
| KTI HMDS | hexamethyl disilazane | KTI Chemical | Sunnyvale, CA |
| Fomblin Perfluorosolv PFS-1 | propene,1,1,2,3,3,3-hexafluoro, oxidized, polymerized | Ausimont USA | Thorofare, NJ |

TABLE IV-continued

Materials suitable for use as releasing agents.

| TRADE NAME | CHEMICAL NAME | SUPPLIER | ADDRESS |
|---|---|---|---|
| Fomblin Y | perfluorinated polyethers | Ausimont USA | Thorofare, NJ |
| Fomblin Z | perfluorinated polyethers | Ausimont USA | Thorofare, NJ |
| Xylan | fluorinated ethylene propylene | Whitford Corp. | West Chester, PA |
| FEP Solution | fluorinated ethylene propylene | Whitford Corp. | West Chester, PA |
| Prosil 9206 | n-octyl-triethoxy-silane | PCR, Inc. | Gainesville, FL |
| S408 | fluorinated ether blend | Stoner, Inc. | Quarryville, PA |
| Fluorad FC-724 | perfluoro compound | 3M | St. Paul, MN |
| Parylene - N | parylene |  |  |
| FS-1265 | fluorosilicone | Dow Corning | Midland, MI |

First material 16 is chosen to (i) prevent second material 20 from contacting the active area, (ii) obviate contamination of second material 20, (iii) be able to withstand any thermal excursions associated with this and subsequent processing and testing and (iv) have a significantly greater thermal coefficient of expansion than second material 20. When first material 16 is applied directly to an acoustic wave transducer, first material 16 also (v) must be chemically compatible with thin aluminum films typically employed for acoustic wave transducers. An example of a material that is not suitable for use directly atop a transducer is conventional room temperature vulcanizing rubber because it evolves acetic anhydride when curing and this chemically attacks aluminum. For the case where gap 18 is desired, first material 16 usefully has a TCE of greater than 30, desirably greater than 50, more desirably greater than 100 and preferably is in the range of about 150 or more. When optional gap 18 is not necessarily required, there are no specific requirements for the TCE of first material 16.

SAW die 10 and first material 16 are then heated (block 46) to a first predetermined temperature, and this may be a part of the molding process, i.e., the heating is done by placing the part in a hot mold. The temperature depends on the thickness and TCE of first material 16, the specific desired operating temperature range, the TCE of second material 20 and the desired or required minimum height as described infra by Eq. 1 and associated text and is usually within a range of from 100 to 250, desirably in a range of from 125 to 225 and preferably in a range of from 150 to 200 degrees Centigrade.

Second material 20 is introduced (block 48) and is induced to set at the first predetermined temperature. Second material 20 may serve as the source of the heat for heating (block 46) SAW die 10 and first material 16 or may provide only part of the heat. Second material 20 is chosen (i) to be chemically compatible with first material 16 and SAW die 10, (ii) to have a significantly lower temperature coefficient of expansion than first material 16 and (iii) to be formable into a rigid block of material at an elevated temperature, i.e., a temperature greater than the normal operating temperatures for completed SAW filter 30. Second material 20 usefully has a TCE on the order of that of substrate 10, usually in the range of 1–20 ppm/°C. or somewhat more, in order to reduce thermally-induced stress in SAW die 10. Examples of materials useful for second material 20 include epoxies and thermoplastics, examples of which are provided in Table II supra. Composite device 30 is cooled (block 50), causing first material 16 to contract and to create opening 18 (FIG. 1) and the process ends (block 52). Opening 18 has a maximum height ($H_{MAX}$) proportional to the thickness of first material 16 (T), the difference in temperature coefficients of expansion of first material 16 ($TCE_1$) and second material 20 ($TCE_2$) and the difference in temperature at which second material 20 sets or becomes rigid ($T_s$) and the ambient temperature ($T_A$), or $$H_{MAX} = T(TCE_1 - TCE_2)(T_s - T_A). \quad (1)$$

The minimum height $H_{MIN}$ occurs at the maximum ambient operating temperature $T_{MAX}$ or $$H_{MIN} = T(TCE_1 - TCE_2)(T_s - T_{MAX}). \quad (2)$$

This height need only be on the order of a few Angstroms because the surface displacements associated with acoustic fields in acoustic wave devices tend to be quite small (sub-Angstrom). The ratio of $TCE_1$ to $TCE_2$ is usefully greater than 1.5:1, desirably greater than 3:1 and preferably greater than 5:1.

EXAMPLE

An acoustic wave device built on $LiNbO_3$ and having a nominal center frequency of about 850 Megahertz was treated with Dow Corning 6633 silicone die overcoat (see Table I) having $TCE_1=150$ ppm/°C. to a thickness of about 0.25 mm. This was molded in an epoxy (6300H novolak epoxy, see Table II) at a temperature of about 175° C. The epoxy has $TCE_2=20$ ppm/°C. A nominal operating temperature range for commercial SAW devices is $-40°$ to $+80°$ C., so the minimum $H_{MIN}$ (at the upper end of the nominal operating temperature range) is on the order of $3 \cdot 10^{-3}$ mm or 3 micrometers.

Applicants have discovered that even without delamination of the silicone material from the SAW die, the device provided an operating filter having 5 dB of insertion loss and slight reduction in center frequency. This is surprising because SAW devices are notoriously sensitive to surface contamination and because silicone rubbers have been employed for years as acoustic absorbers to provide reflection-free acoustic path terminations when these are desired. The untreated device had an insertion loss of about 2 dB. The excess attenuation introduced by the silicone rubber overlay is thus only 3 dB.

APPLICATION

Figure 3:
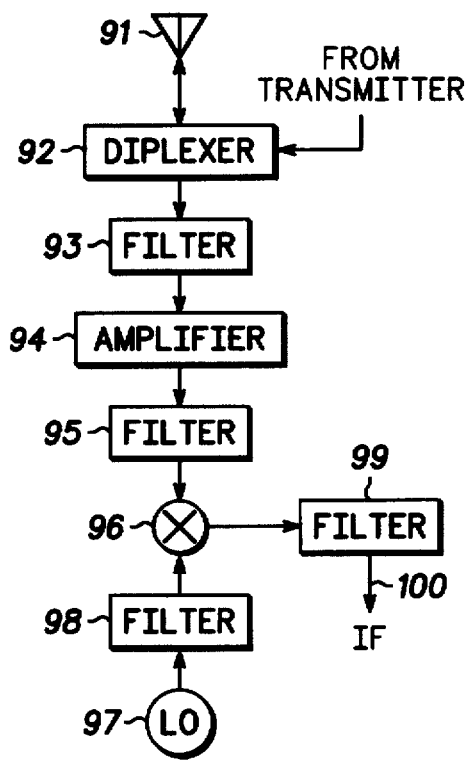
FIG. 3 is a simplified schematic diagram of a radio employing multiple filters, as for example, one or more SAW filters packaged according to the present invention.

FIG. 3 is a simplified schematic diagram indicating how the above-described filters according to the present invention are advantageously used in radio circuit 90. Radio circuit 90 comprises antenna 91 sending or receiving signals from optional diplexer 92 (which is coupled to the transmitter if one is used). Diplexer 92 sends an incoming signal to filter 93 which passes the resulting band limited signal to amplifier 94. From amplifier 94 the signal passes through another band limiting filter 95 to mixer 96. Mixer 96 also receives a signal from local oscillator 97 through band limiting filter 98. The mixed signal from mixer 96 passes through band limiting filter 99 which removes the local oscillator signal and sends the result to the receiver IF via output 100.

Filters 93, 95, 98 and/or 99 are advantageously SAW filters of the type described here and made according to the structure and method of the present invention, but of varying frequency or other properties according to the particular desired function. For example, filter 93 removes input RF frequencies outside the band in which the receiver is intended to operate. This is particularly useful for narrow band receivers such as are frequently required in cellular phone and paging applications and the like.

Filter 95 may have the same or a different pass band than filter 93 and removes any undesired harmonics generated by amplifier 94 or other out-of-band signals not removed by filter 93. Filter 98 desirably passes the LO frequency and stops undesired harmonics thereof. Filter 99 desirably passes the sum or difference frequencies produced by mixer 96, and blocks the local oscillator and input RF frequencies. This is important to avoid saturating the input stages of the IF amplifier which is typically coupled to output 100. Thus, electronic apparatus, and especially radios have improved properties as a result of the improved properties of the SAW filters of the present invention.

Thus, an acoustic wave device package and attendant packaging method have been described which overcome specific problems and accomplish certain advantages relative to prior art methods and mechanisms. The improvements over known technology are significant. The expense, complexities and large volumes of prior art hermetic packages are avoided. Similarly, a low-weight package well suited to mass production techniques is realized.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. An acoustic wave device packaged by a method for packaging an acoustic wave device, said method comprising steps of:

providing a first material having a temperature coefficient of expansion of one hundred parts per million per degree Centigrade or more on an active surface of said acoustic wave device;

exposing said first material to ultraviolet radiation to provide enhanced adhesion to a second material;

molding said second material having a temperature coefficient of expansion of less than thirty parts per million per degree Centigrade about said acoustic wave device and said first material, said second material having a second temperature coefficient of expansion less than that of said first material; and cooling said first material, said second material and said acoustic wave device to provide a packaged acoustic wave device having a void between said acoustic wave device and said first material.

2. An acoustic wave device package comprising:

a first material having a temperature coefficient of expansion of one hundred parts per million per degree Centigrade or more disposed above a gap over a surface of an acoustic wave device; and a second material having a temperature coefficient of expansion of less than thirty parts per million per degree Centigrade disposed surrounding said first material and atop said acoustic wave device.

3. A package as claimed in claim 2, wherein said acoustic wave device comprises a substrate chosen from a group consisting of lithium niobate, lithium tantalate or gallium arsenide.

4. A package as claimed in claim 2, wherein said first material comprising dimethyl siloxane and having a temperature coefficient of expansion of one hundred parts per million per degree Centigrade or more.

5. A package as claimed in claim 2, wherein said second material is chosen from a group consisting of novolac epoxy, polyester, phenolic, liquid crystal polymer, polytetrafluoroethylene, polyaryletherketone and polyimide.

6. A package as claimed in claim 5, wherein said second material substantially surrounds said first material and said acoustic wave device.

7. In a radio, an acoustic wave device package comprising:

a first material having a temperature coefficient of expansion of one hundred parts per million per degree Centigrade or more disposed above a gap disposed over an active area of an acoustic wave device; and a second material having a temperature coefficient of expansion of less than thirty parts per million per degree Centigrade disposed surrounding said first material and atop said acoustic wave device.

8. A package as claimed in claim 7, wherein said acoustic wave device comprises a substrate chosen from a group consisting of lithium niobate, lithium tantalate or gallium arsenide.

9. A package as claimed in claim 7, wherein said second material substantially surrounds said first material and said acoustic wave device.

10. A package as claimed in claim 9, wherein said second material is chosen from a group consisting of novolac epoxy, polyester, phenolic, liquid crystal polymer, polytetrafluoroethylene, polyaryletherketone and polyimide.

11. A frequency selection component packaged by a method for packaging a acoustic wave device, said method comprising steps of:

providing a first material on an active surface of said acoustic wave device, said first material having a first temperature coefficient of expansion of one hundred parts per million per degree Centigrade or more;

treating said first material to provide enhanced adhesion to said second material, wherein said treating step includes exposing said first material to ultraviolet radiation;

heating said acoustic wave device and said first material to a predetermined first temperature in a range of from 100 to 250 degrees Centigrade;

molding a second material about said acoustic wave device and said first material, said second material having a second temperature coefficient of expansion less than thirty parts per million per degree Centigrade; and cooling said first material, said second material and said acoustic wave device to provide a packaged acoustic wave device including a void between said acoustic wave device and said first material.

12. An acoustic wave device packaged by a method comprising steps of:

providing a first material on an active surface of said acoustic wave device, said first material having a first temperature coefficient of expansion of one hundred parts per million per degree Centigrade or more;

treating said first material to provide enhanced adhesion to said second material, wherein said treating step includes exposing said first material to ultraviolet radiation;

heating the acoustic wave device and the first material to a predetermined first temperature in a range of from 100 to 250 degrees Centigrade;

molding a second material about said acoustic wave device and said first material, said second material having a second temperature coefficient of expansion less than thirty parts per million per degree Centigrade; and cooling said first material, said second material and said acoustic wave device to provide a packaged acoustic wave device including a void between said acoustic wave device and said first material.

* * * * *